United States Patent
Seyyedy

Patent Number: 5,996,106
Date of Patent: Nov. 30, 1999

[54] MULTI BANK TEST MODE FOR MEMORY DEVICES

[75] Inventor: Mirmajid Seyyedy, Boise, Id.

[73] Assignee: Micron Technology, Inc., Boise, Id.

[21] Appl. No.: 08/795,694

[22] Filed: Feb. 4, 1997

[51] Int. Cl.[6] .................................................. G11C 29/00
[52] U.S. Cl. .................. 714/763; 714/710; 714/718; 714/765; 714/720; 370/352; 370/355; 370/376; 370/438; 370/463; 365/189.05; 365/230.03; 365/200; 365/201; 379/191; 379/193; 379/253; 379/255
[58] Field of Search ...................... 371/40.11, 40.4, 371/21.1, 10.2, 21.2; 370/463, 438, 355, 352, 376; 379/253, 191, 193, 255; 365/189.05, 230.03, 200, 201; 395/309, 182.1, 182.21, 855; 711/1, 2, 3, 4, 5; 257/905, 906, 907; 714/720

[56] References Cited

U.S. PATENT DOCUMENTS

| | | | |
|---|---|---|---|
| 3,751,649 | 8/1973 | Hart, Jr. | 714/718 |
| 4,055,754 | 10/1977 | Chesley | 714/720 |
| 4,061,908 | 12/1977 | Jonge et al. | 714/720 |
| 4,389,715 | 6/1983 | Eaton et al. | 365/200 |
| 4,532,611 | 7/1985 | Countryman, Jr. | 365/200 |
| 4,639,915 | 1/1987 | Bosse | 371/10 |
| 4,654,849 | 3/1987 | White, Jr. et al. | 714/718 |
| 4,656,609 | 4/1987 | Higuchi et al. | 365/200 |
| 4,745,582 | 5/1988 | Fukushi et al. | 365/200 |
| 4,868,823 | 9/1989 | White, Jr. et al. | 714/718 |
| 4,872,168 | 10/1989 | Aadsen et al. | 371/21.3 |
| 4,937,465 | 6/1990 | Johnson et al. | 307/202.1 |
| 5,073,891 | 12/1991 | Patel | 714/720 |
| 5,107,501 | 4/1992 | Zorian | 714/720 |
| 5,155,704 | 10/1992 | Walther et al. | 365/201 |
| 5,185,744 | 2/1993 | Arimoto et al. | 371/21.2 |
| 5,195,099 | 3/1993 | Ueda et al. | 371/40.4 |
| 5,212,442 | 5/1993 | O'Toole et al. | 324/158 R |
| 5,231,605 | 7/1993 | Lee | 365/201 |
| 5,245,577 | 9/1993 | Duesman et al. | 365/201 |
| 5,317,573 | 5/1994 | Bula et al. | 371/10.3 |
| 5,329,488 | 7/1994 | Hashimoto | 365/200 |
| 5,416,740 | 5/1995 | Fujita et al. | 365/200 |
| 5,442,641 | 8/1995 | Beranger et al. | 371/21.2 |
| 5,442,642 | 8/1995 | Ingalls et al. | 371/22.5 |
| 5,469,393 | 11/1995 | Thomann | 365/201 |
| 5,475,648 | 12/1995 | Fujiwara | 365/230.06 |
| 5,522,038 | 5/1996 | Lindsay et al. | 395/183.17 |
| 5,523,976 | 6/1996 | Okazawa et al. | 365/200 |
| 5,526,364 | 6/1996 | Roohparvar | 371/22.1 |
| 5,535,161 | 7/1996 | Kato | 365/200 |
| 5,544,108 | 8/1996 | Thomann | 365/201 |
| 5,557,574 | 9/1996 | Senoo et al. | 365/201 |
| 5,568,435 | 10/1996 | Marr | 365/201 |
| 5,602,781 | 2/1997 | Isibe | 365/189.05 |
| 5,617,364 | 4/1997 | Hatakeyama | 365/200 |
| 5,644,578 | 7/1997 | Ohsawa | 371/21.2 |
| 5,671,392 | 9/1997 | Paris et al. | 711/119 |
| 5,675,543 | 10/1997 | Rieger | 365/200 |
| 5,680,362 | 10/1997 | Paris et al. | 365/230.01 |
| 5,777,942 | 7/1998 | Dosaka et al. | 365/230.03 |

OTHER PUBLICATIONS

"1995 Data Sheet", *16M SDRAM*, Samsung Electronics, Inc., 69, (Oct. 1995).

*Primary Examiner*—William Grant
*Assistant Examiner*—McDieunel Marc
*Attorney, Agent, or Firm*—Schwegman, Lundberg Woessner & Kluth P.A.

[57] ABSTRACT

A multiple bank memory device is described which can be tested by accessing the multiple memory banks simultaneously. The memory includes a test mode trigger which initiates a test which writes and reads from memory cells located in different memory banks. Error detection circuitry evaluates data read from different memory banks and determines if a defect is present in the memory cells. Different test patterns and techniques are described for identifying defective memories.

44 Claims, 2 Drawing Sheets

| 1 | 1 | 1 | 1 |
|---|---|---|---|
| 1 | 1 | 1 | 1 |
| 1 | 1 | 1 | 1 |
| 1 | 1 | 1 | 1 |

| 0 | 0 | 0 | 0 |
|---|---|---|---|
| 0 | 0 | 0 | 0 |
| 0 | 0 | 0 | 0 |
| 0 | 0 | 0 | 0 |

| 1 | 1 | 1 | 1 |
|---|---|---|---|
| 0 | 0 | 0 | 0 |
| 1 | 1 | 1 | 1 |
| 0 | 0 | 0 | 0 |

| 1 | 0 | 1 | 0 |
|---|---|---|---|
| 1 | 0 | 1 | 0 |
| 1 | 0 | 1 | 0 |
| 1 | 0 | 1 | 0 |

| 0 | 1 | 0 | 1 |
|---|---|---|---|
| 1 | 0 | 1 | 0 |
| 0 | 1 | 0 | 1 |
| 1 | 0 | 1 | 0 |

MULTI BANK TEST MODE FOR MEMORY DEVICES

TECHNICAL FIELD OF THE INVENTION

The present invention relates generally to memory devices and in particular the present invention relates to memory devices having multi bank arrays.

BACKGROUND OF THE INVENTION

Integrated circuit memories such as dynamic random access memories have thousands of memory storage cells. These storage cells are typically fabricated as individual capacitors and arranged in rows and columns. The rows and columns of memory cells are referred to as a memory cell array. To insure that a memory device is fully operational, each of the individual memory cells is operationally tested. Further, the memory cells are tested in combination, or patterns, to identify possible failures due to coupling between adjacent memory cells or features.

As the population of memory cells in a memory device increase, the possibility of memory cell defects increase. Thus, more complex and time consuming tests are required for each memory device. In addition, some memory devices such as synchronous dynamic random access memories (SDRAMs) have multiple banks of memory cell arrays which must be tested.

For the reasons stated above, and for other reasons stated below which will become apparent to those skilled in the art upon reading and understanding the present specification, there is a need in the art for an economical method of testing memory devices. In particular, an economical way of testing multiple bank memory devices is needed.

SUMMARY OF THE INVENTION

The above mentioned problems with memory devices and other problems are addressed by the present invention and which will be understood by reading and studying the following specification. A test method is described which allows multiple banks of memory arrays to be tested simultaneously.

In particular, the present invention describes a memory device comprising multiple banks of memory cells, a test mode trigger, control circuitry adapted to simultaneously perform a test on the multiple banks of memory cells in response to the test mode trigger, and error detection circuitry to receive test data and identify defective memory cells.

In another embodiment, a method of testing a memory device having multiple banks of memory cells is described. The method comprises the steps of initiating a test mode, simultaneously accessing the multiple banks of memory cells, storing data in the multiple banks of memory cells, and simultaneously reading data from the multiple banks of memory cells.

DETAILED DESCRIPTION OF THE INVENTION

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
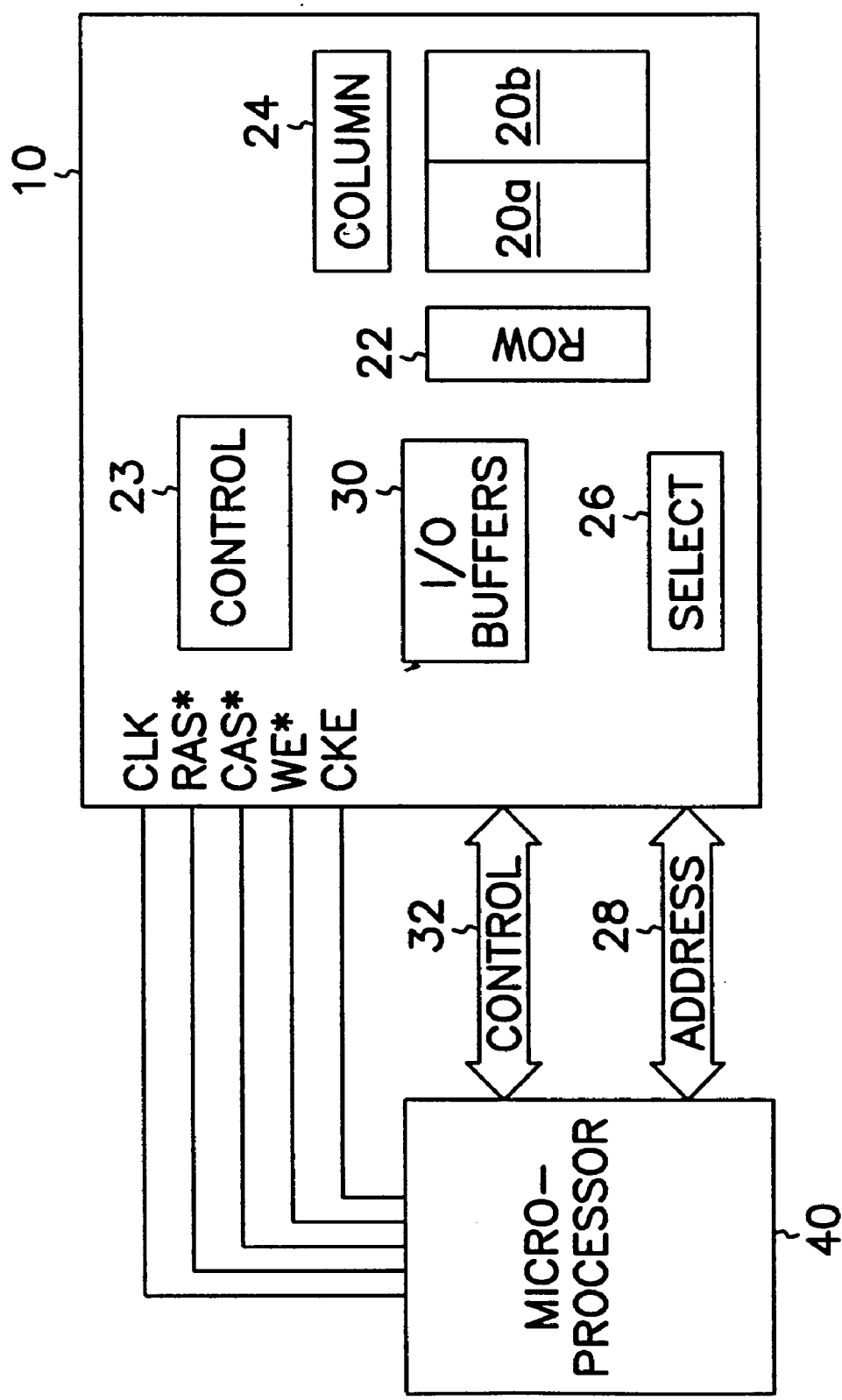
FIG. 1 is a block diagram of a memory device of the present invention.

A typical SDRAM 10 is illustrated in FIG. 1. The memory has an array of dynamic memory cells arranged in two separately addressable banks, 20a and 20b. The memory cells are accessed in response to an address signal provided on address lines 28 using row 22 and column 24 decode circuitry. A bank select circuit 26 is used to select one of the two array banks in response to an address provided on address lines 28. Input/output buffers 30 are provided for bi-directional data communication via data communication lines 32. Control circuitry 23 regulates the SDRAM operations in response to control signals which include, but are not limited to, a Clock (CLK), Row Access Strobe (RAS*), Column Access Strobe (CAS*), Write Enable (WE*), and Clock Enable (CKE). An external processor 40 is provided for both bi-directional data communication and control with the memory. For a more detailed description of the operation of a SDRAM see 1995 *Data Sheet* 16M *SDRAM*, October 1995, published by Samsung Electronics and incorporated herein by reference.

A typical SDRAM uses one of the address lines 28 to identify a memory array bank which is to be accessed during a memory operation. Under normal operation, therefore, only one memory bank array is accessed at a time. It will be appreciated by reading the following description that the present invention is not limited to SDRAM's but is applicable to any memory having multiple memory arrays.

Testing

The individual memory cells of a memory array must be tested after manufacturing to determine the location of any defective memory cells. Redundancy is typically provided in memory devices to allow defective cells to be replaced, thereby salvaging the memory device. Defects which are experienced in a fabricated memory device range from continuity defects, such as open circuits and short circuits, to current leakage between surrounding features and memory cells. Defects caused by coupling between adjacent features can also be experienced.

To test individual memory cells for continuity defects a simple read-write test can be conducted on each memory cell. That is, a logic "one" can be written to a memory cell and then the memory cell is read to determine if the data was correctly stored. Likewise, a logic "zero" can be written to a memory cell and then the memory cell can be read to determine if a defect is present. These types of tests are effective where a fully open or closed circuit defect is experienced. A more troublesome defect to detect is a slow leakage current. Because of the wide variables experienced in data storage to a memory device, current leakage from a memory cell, or current leakage to a memory cell is difficult to detect without exhaustive testing.

To facilitate testing for defects caused by interactions between features of a memory device, data is written to a memory array in predetermined background patterns. The patterns are chosen to exploit weaknesses in a memory design. That is, each individual memory design is susceptible to different failure modes. If these failure modes can be identified and replicated, weak memory devices are more readily identified.

Figures 2, 3, 4, 5, 6, 7:
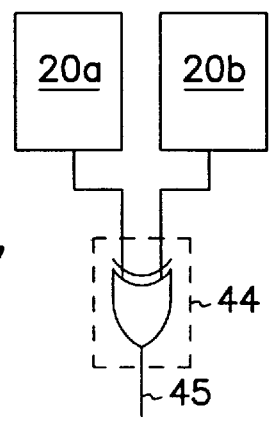
FIG. 2 is a memory array background test pattern.
FIG. 3 is another background test pattern.
FIG. 4 is another background test pattern.
FIG. 5 is another background test pattern.
FIG. 6 is another background test pattern.
FIG. 7 is a block diagram of an error detection circuit of the memory device of claim 1.

Some of the more common background test patterns used are illustrated in FIGS. 2–6. These test patterns include data stored in all the memory cells as either all ones or all zeros, as shown in FIGS. 2 and 3, respectively. The memory array can be written to store data in alternating rows or columns, as shown in FIGS. 4 and 5. Additional patterns can be used such as a checkerboard pattern shown in FIG. 6. It will be appreciated by those skilled in the art that the background pattern is written to a memory array in a predetermined sequence. This sequence can be selected to exploit known failure modes.

After a background pattern has been stored in the memory array, two types of tests can be conducted to identify memory cell defects. The first test comprises reading the memory cells and determining if the background pattern data has changed. Adverse interactions between adjacent memory cells and components can be identified in this manner. A second, "dynamic" test of the memory cells can also be conducted. This dynamic test is conducted by writing and reading either rows or columns of the memory array. This process is referred to as "walking" rows or columns across the array.

It will be appreciated that rows and columns which are walked across the array can be either uniform or patterned. That is, the row or column can be all ones or zeros, or some pattern of ones and zeros. The pattern will be dependant upon the background pattern used and particular failure modes identified in the memory device being tested. Further, the memory cells which are read while a row or column is walked across the array can be either the cells which were written to, or some adjacent row or column. Again, the memory cells selected will be dependant upon known failure modes for particular memory devices.

Testing Multiple Banks

As discussed above, SDRAMs 10 have multiple memory array banks 20a and 20b. The memory device is typically tested by writing and reading to each memory array bank individually. Testing multiple bank memories in this manner is time consuming and thus expensive.

To minimize test time, the present invention provides an apparatus and method for testing multiple memory array banks simultaneously. The SDRAM memory device 10 incorporating the present invention includes control circuitry 23 which initiates a test mode where a test pattern is written to multiple banks simultaneously. The control circuitry also simultaneously walks rows and columns across multiple memory banks while reading data from the multiple banks. Data read from the multiple banks is evaluated to identify defects. For example, data read from two memory banks can be logically XORed to identify defective memory cells. FIG. 7 illustrates a simplified detection circuit 44 operating as an exclusive OR. Data is read from the multiple memory banks, 20a and 20b, and input into the detection circuit. If data read from both memory banks is not identical, the output 45 of the detection circuit will indicate an error. Further testing can be conducted to determine which memory bank contains the defective memory cell.

To initiate the multiple bank test, any test mode trigger known to those skilled in the art can be used, including but not limited to electronic keys, supervoltages, and test pads. The test mode trigger is provided in control circuit 23 of memory 10, and the test mode trigger is preferably activated in response to a signal provided on an input line from the processor 40.

CONCLUSION

A memory device has been described which has multiple addressable banks of memory cells. Testing has been described which is conducted on the multiple banks simultaneously to minimize test time. Data read from the memory device during testing is logically combined to identify defective memory cells. In a preferred embodiment, the memory device is an SDRAM and the multiple bank test is initiated using a test mode trigger.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:

multiple banks of memory cells;

a test mode trigger;

control circuitry adapted to simultaneously perform a test on the multiple banks of memory cells in response to the test mode trigger by writing preselected data to the multiple banks of memory cells and then simultaneously walking rows or columns across the multiple banks of memory cells while reading test data simultaneously from the rows or columns; and error detection circuitry to receive the test data and identify defective memory cells.

2. The memory device of claim 1 wherein the error detection circuitry is a logical circuit.

3. The memory device of claim 1 wherein the test mode trigger is a supervoltage provided on an input.

4. The memory device of claim 1 wherein the memory device is a synchronous dynamic random access memory (SDRAM).

5. A synchronous dynamic random access memory (SDRAM) comprising:

multiple banks of memory cells;

a test mode trigger;

control circuitry adapted to simultaneously perform a test on the multiple banks of memory cells in response to the test mode trigger by writing preselected data to the multiple banks of memory cells and then simultaneously walking rows or columns across the multiple banks of memory cells while reading test data simultaneously from the rows or columns; and error detection circuitry to receive the test data and identify defective memory cells.

6. The SDRAM of claim 5 wherein the test mode trigger is an electronic key.

7. The SDRAM of claim 5 wherein the error detection circuitry comprises an XOR.

8. A test system comprising:

a memory device comprising:

multiple banks of memory cells;

a test mode trigger;

control circuitry adapted to simultaneously perform a test on the multiple banks of memory cells in response to the test mode trigger, the test comprising writing preselected data to the multiple banks of memory cells and then simultaneously walking rows or columns across the multiple banks of memory cells while reading test data simultaneously from the rows or columns; and error detection circuitry to receive the test data and identify defective memory cells; and a processor coupled to the memory device.

9. The test system of claim 8 wherein the test mode trigger is an electronic key triggered by the processor.

10. A method of testing a memory device having multiple banks of memory cells, the method comprising:

initiating a test mode;

simultaneously accessing the multiple banks of memory cells;

storing preselected data in the multiple banks of memory cells; and simultaneously reading data from the multiple banks of memory cells by walking rows or columns across the multiple banks of memory cells while reading test data simultaneously from the rows or columns.

11. The method of claim 10, further comprising detecting an error based upon the test data read from the multiple banks of memory cells.

12. The method of claim 10 wherein storing preselected data comprises storing preselected data in each of the multiple banks of memory cells as a background pattern.

13. The method of claim 12 wherein the background pattern is arranged as stripes, such that adjacent rows of the multiple banks of memory cells store different data.

14. The method of claim 12 wherein the background pattern is arranged as stripes, such that adjacent columns of the multiple banks of memory cells store different data.

15. The method of claim 12 wherein the background pattern is arranged in a checkered configuration.

16. The method of claim 10 wherein the step of storing preselected data comprises walking either rows or columns of preselected data across the multiple banks of memory cells.

17. A memory device comprising:

two separately addressable banks of memory cells; and a control circuit to write preselected data simultaneously to the banks of memory cells and to read test data simultaneously from the banks of memory cells by walking rows or columns across the banks of memory cells while reading the test data simultaneously from the rows or columns to test the memory device.

18. The memory device of claim 17, further comprising a test mode trigger to prompt the control circuit to write the preselected data simultaneously to the banks of memory cells and to read the test data simultaneously from the banks of memory cells.

19. The memory device of claim 18 wherein the test mode trigger comprises a supervoltage, an electronic key, or a test pad.

20. The memory device of claim 17, further comprising an error detection circuit to compare the test data read simultaneously from the banks of memory cells.

21. The memory device of claim 20 wherein the error detection circuit comprises an exclusive OR logic gate.

22. The memory device of claim 17 wherein the control circuit is structured to write a test pattern simultaneously to the banks of memory cells and to read the test data simultaneously from the banks of memory cells to test the memory device.

23. A memory device comprising:

two separately addressable banks of memory cells;

a bank select circuit;

a test mode trigger;

a control circuit to write preselected data simultaneously to the banks of memory cells and to read test data simultaneously from the banks of memory cells by walking rows or columns across the banks of memory cells while reading the test data simultaneously from the rows or columns to test the memory device; and an error detection circuit to detect errors in the test data.

24. The memory device of claim 23 wherein the test mode trigger comprises a supervoltage, an electronic key, or a test pad.

25. The memory device of claim 23 wherein the error detection circuit comprises an exclusive OR logic gate to compare the test data.

26. The memory device of claim 23 wherein the memory device comprises an SDRAM including input/output buffers and row and column decode circuitry.

27. The memory device of claim 23 wherein the control circuit is structured to write a test pattern simultaneously to the banks of memory cells.

28. A system comprising:

a processor; and a memory device comprising:

two separately addressable banks of memory cells; and a control circuit to write preselected data simultaneously to the banks of memory cells and to read test data simultaneously from the banks of memory cells by walking rows or columns across the banks of memory cells while reading the test data simultaneously from the rows or columns to test the memory device.

29. The system of claim 28 wherein the memory device further comprises:

a test mode trigger to prompt the control circuit to write preselected data simultaneously to the banks of memory cells and to read test data simultaneously from the banks of memory cells; and an error detection circuit to compare the test data.

30. The system of claim 29 wherein:

the memory device is coupled to the processor to exchange signals with the processor;

the test mode trigger comprises a supervoltage, an electronic key, or a test pad; and the error detection circuit comprises an exclusive OR logic gate.

31. The system of claim 28 wherein the control circuit is structured to write a test pattern simultaneously to the banks of memory cells.

32. The system of claim 28 wherein the memory device comprises an SDRAM including a bank select circuit, input/output buffers, and row and column decode circuitry.

33. A system comprising:

a processor; and a memory device connected to the processor to exchange signals with the processor, the memory device comprising:

two separately addressable banks of memory cells;

a bank select circuit; and means for simultaneously testing the memory cells in each of the banks by writing preselected data to the banks of memory cells and then simultaneously walking rows or columns across the banks of memory cells while reading test data simultaneously from the rows or columns.

34. The system of claim 33 wherein the memory device further comprises:

means for triggering the testing of the memory cells; and means for detecting errors in data read from the memory cells during the testing of the memory cells.

35. A method comprising:

writing preselected data simultaneously to two separately addressable banks of memory cells in a memory device;

reading test data simultaneously from the banks of memory cells by simultaneously walking rows or columns across the banks of memory cells while reading the test data simultaneously from the rows or columns; and evaluating the test data to identify incorrect test data.

36. The method of claim 35, further comprising initiating a test of the memory device with a test mode trigger.

37. The method of claim 35, further comprising initiating a test of the memory device with a supervoltage, an electronic key, or a test signal applied to a test pad.

38. The method of claim 35 wherein evaluating the test data comprises comparing test data from memory cells in the two banks in an exclusive OR logic gate to identify memory cells that have provided the incorrect test data.

39. The method of claim 35 wherein writing preselected data simultaneously comprises writing a test pattern simultaneously to the banks of memory cells.

40. A method comprising:

exchanging signals between a processor and a memory device in a system;

writing preselected data simultaneously to two separately addressable banks of memory cells in the memory device;

reading test data simultaneously from the banks of memory cells by simultaneously walking rows or columns across the banks of memory cells while reading the test data simultaneously from the rows or columns; and evaluating the test data to identify incorrect test data.

41. The method of claim 40, further comprising initiating a test of the memory device with a supervoltage, an electronic key, or a test signal applied to a test pad.

42. The method of claim 40 wherein evaluating the test data comprises comparing test data from memory cells in the two banks in an exclusive OR logic gate to identify memory cells that have provided the incorrect test data.

43. The method of claim 40 wherein writing preselected data simultaneously comprises writing a test pattern simultaneously to the banks of memory cells.

44. A method comprising:

initiating a test of a memory device having two separately addressable banks of memory cells;

a step for writing preselected data simultaneously to each of the banks of memory cells;

a step for reading test data simultaneously from the banks of memory cells by simultaneously walking rows or columns across the banks of memory cells while reading the test data simultaneously from the rows or columns; and detecting errors in the test data.

* * * * *